US012755912B2

(12) United States Patent
Hintze et al.

(10) Patent No.: US 12,755,912 B2
(45) Date of Patent: Oct. 6, 2026

(54) ARRANGEMENT AND METHOD FOR AUTOMATICALLY CONFIGURING A MAGNETIC DRIVE

(71) Applicant: Siemens Aktiengesellschaft, Munich (DE)

(72) Inventors: Thomas Hintze, Falkensee (DE); Martin Bindrich, Berlin (DE); Detlef Schwope, Berlin (DE); Malte Georg Hirte, Petershagen (DE); Mario Schäfer, Potsdam (DE); Stefan Lecheler, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 294 days.

(21) Appl. No.: 18/577,354

(22) PCT Filed: Jun. 24, 2022

(86) PCT No.: PCT/EP2022/067346
§ 371 (c)(1),
(2) Date: Jan. 8, 2024

(87) PCT Pub. No.: WO2023/280597
PCT Pub. Date: Jan. 12, 2023

(65) Prior Publication Data

US 2024/0186088 A1 Jun. 6, 2024

(30) Foreign Application Priority Data

Jul. 7, 2021 (DE) ..................... 10 2021 207 110.4

(51) Int. Cl.
*H01H 33/666* (2006.01)
*G01R 31/327* (2006.01)
(Continued)

(52) U.S. Cl.
CPC ....... *H01H 33/6662* (2013.01); *G01R 31/327* (2013.01); *H01H 11/00* (2013.01); *H01H 33/38* (2013.01)

(58) Field of Classification Search
CPC H01H 3/28; H01H 3/46; H01H 3/503; H01H 3/54; H01H 2003/506; H01H 9/541;
(Continued)

(56) References Cited

U.S. PATENT DOCUMENTS 6,020,567 A * 2/2000 Ishikawa .................. H01H 3/28 218/120
7,483,254 B1 1/2009 Wang
(Continued)

FOREIGN PATENT DOCUMENTS

DE 4304921 C1 8/1994
DE 112005001085 T5 4/2007
(Continued)

OTHER PUBLICATIONS

Siemens, 3TM, Vacuum contactor 7.2 kV-15 kV, 3-pole, 4.15 kV-6.9 kV, 1-pole—English Version.
(Continued)

*Primary Examiner* — William A Bolton
(74) *Attorney, Agent, or Firm* — Laurence A. Greenberg; Werner H. Stemer; Ralph E. Locher

(57) ABSTRACT

An arrangement automatically configures a magnetic drive. The arrangement contains a vacuum switching device having a movable contact and a fixed contact, and a magnetic drive having two coils which are switched in parallel or in series. The magnetic drive, when switched on, exerts an attractive force on an armature and moves the armature. A transmission mechanism is configured to translate a movement of the armature into a movement of the movable contact towards the fixed contact. An actuating device is
(Continued)

provided for the magnetic drive, which actuating device can be configured to an input voltage. The magnetic drive has controllable switching devices for the coils, and a configuration device is configured to measure the input voltage and to configure the actuating device to the measured input voltage, and to connect the coils by use of the controllable switching devices depending on the measured input voltage.

12 Claims, 1 Drawing Sheet

(51) Int. Cl.
*H01H 11/00* (2006.01)
*H01H 33/38* (2006.01)

(58) Field of Classification Search
CPC ........ H01H 9/542; H01H 9/547; H01H 9/548; H01H 2009/544; H01H 2009/546; H01H 33/6662; H01H 33/38; H01H 11/00; H01H 47/325; H01H 50/44; G01R 31/327
USPC ........ 218/140, 118, 120, 141, 142, 153, 154
See application file for complete search history.

(56) References Cited

U.S. PATENT DOCUMENTS

| | | | | |
|---|---|---|---|---|
| 7,936,549 | B2 | 5/2011 | Takeuchi et al. | |
| 9,293,243 | B2 * | 3/2016 | Kim | H01F 7/1615 |
| 9,837,229 | B2 * | 12/2017 | Chaly | H01H 47/325 |
| 10,593,493 | B2 * | 3/2020 | Takasuka | H01H 33/6662 |
| 2018/0294120 | A1 * | 10/2018 | Lapiere | H01H 47/02 |
| 2019/0207598 | A1 * | 7/2019 | Yu | H03K 17/0822 |
| 2020/0194206 | A1 * | 6/2020 | Wang | H01H 50/44 |
| 2020/0251295 | A1 * | 8/2020 | Ängquist | H01H 50/56 |
| 2020/0411261 | A1 * | 12/2020 | Zhou | H01H 33/59 |

FOREIGN PATENT DOCUMENTS

| | | | |
|---|---|---|---|
| FR | 2943840 | A1 | 10/2010 |
| JP | 2521077 | Y2 | 12/1996 |

OTHER PUBLICATIONS

PCT International Search Report and Written Opinion of International Searching Authority mailed Oct. 27, 2022, corresponding to PCT International Application No. PCT/E P2022/067346 filed Jun. 24, 2022_ English translation.

* cited by examiner

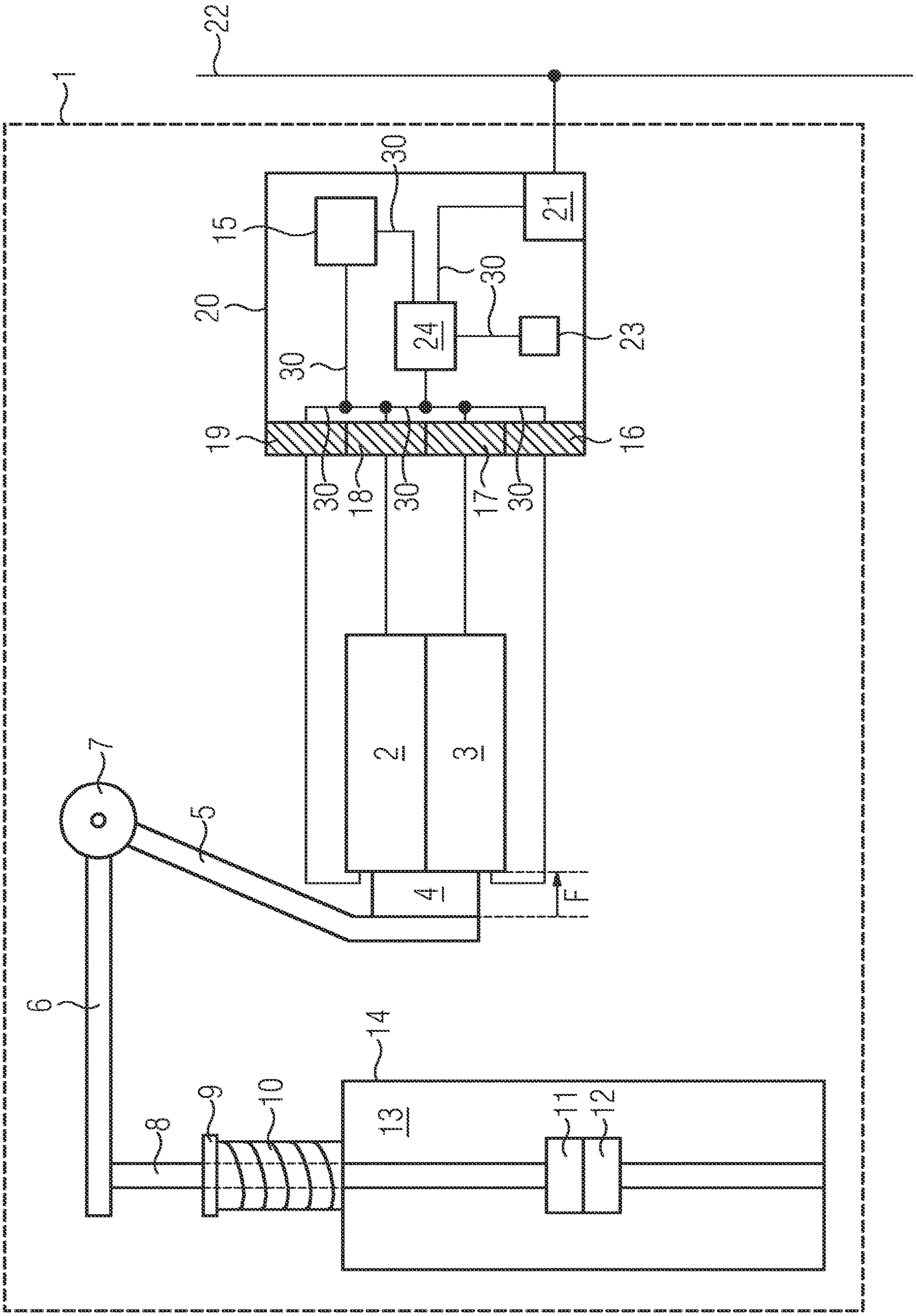
22
1
30
15
21
20
30
30
24
23
30
19
16
30
18
30
17
30
2
3
7
5
4
F
6
14
9
10
8
13
11
12

ARRANGEMENT AND METHOD FOR AUTOMATICALLY CONFIGURING A MAGNETIC DRIVE

FIELD AND BACKGROUND OF THE INVENTION

The invention relates to an arrangement for automatically configuring a magnetic drive according to the preamble of the independent arrangement claim and to a method for automatically configuring a magnetic drive according to the preamble of the independent method claim.

The instruction manual "3TM vacuum contactor 7.2 kV-15 kV, 3-pole, 4.15 kV-6.9 kV, 1-pole", order code: 9229 0106 100 0, Siemens AG 2020 discloses a medium-voltage switching unit comprising a vacuum switching having an electromagnetic drive. The magnetic drive can exert a magnetic force on what is known as an armature plate and attract it. The movement of the armature plate is translated mechanically into a movement for pressing the movable contact against the fixed contact within the vacuum switching device. In this unit, like in magnetic drives of switches and contactors, two magnetic coils are often used, these having to be interconnected either in parallel (for example for AC/DC in countries with 115 V mains voltage) or in series (for example for AC/DC in countries with 230 V mains voltage) depending on the level of the input voltage. Even if the rated mains voltage of the customer is known, the supply voltage selected for the contactor (AC voltage, DC voltage, rated voltage) is often not yet decided in early phases of installation planning. The customer often selects the voltage supply only when the total power requirement of all of the installation components is known and the control units for actuating the contactors have also been selected.

When the coils are interconnected, attention must be paid to the correct polarity of the coil connections. As shown on pages 27 and 28 of the instruction manual, the actuating electronics system has four plug contacts X5, X6, X7, X8 with two plugs each to which the 2×2 coil connections must be plugged. There is therefore a total of 24 different plug options, of which only 12 are interconnected correctly (in parallel or in series). The manual interconnection that is preconfigured in the factory for the respective country of delivery is therefore susceptible to errors.

In addition, the actuating electronics system must also be configured according to the level of the input voltage used. This is done either by plug bridges or switches on the electronics system or, when using a microcontroller, by appropriate parameter configuration. This step is also preconfigured in the factory. The configuration of the actuating electronics system is required because it is necessary to perform regulation to different switch-on and holding currents depending on coil configuration (in parallel, in series, rated voltage).

In order to make it possible for customers to reconfigure the switching unit retrospectively to another voltage than the one set in the factory, the connections are accessible behind a cover plate that has been screwed on. The configuration of the contactor is enclosed with the product in the form of drawings and text in all required languages in a customer-friendly form, for example in the form of a device handbook or a separate assembly guide. The descriptions are therefore very wide-ranging. If the description is not available in situ, correct configuration ranges from difficult to impossible.

Another problem is the storage of replacement parts for the customer. The rapid replacement of a faulty contactor requires either individual configuration including the replugging of the coil connections of an available spare contactor or stocking all of the necessary variants.

SUMMARY OF THE INVENTION

Proceeding from the known contactor, the object of the invention is to specify an arrangement using which it is simple, fast and reliable to modify the magnetic drive for another input voltage.

The invention achieves this object by way of an arrangement for automatically configuring a magnetic drive as claimed in the independent arrangement claim.

In order to achieve low downtimes of the energy distribution installation, the simplest possible exchange without complex interconnection of the coils that is susceptible to errors adds value for the customer. Short downtimes in the event of faults in the meantime are an economically decisive factor when selecting a contactor since the downtimes affect the price of electricity in the field of energy distribution. It is a significant advantage of the invention that there is no manual configuration outlay, which is less susceptible to errors and quicker than previously. Furthermore, despite the somewhat higher manufacturing costs (including routine testing costs and configuration costs) of an arrangement according to the invention, savings are achieved during production because there is no manual configuration outlay and checking of the correct wiring, possibly even according to the four-eyes principle.

The advantage of automatic identification of the level of the input voltage and the associated automatic coil interconnection and configuration of the actuating electronics system is that, on the one hand, errors during manual interconnection and configuration are prevented and, on the other, fewer variants have to be manufactured.

Customer documentation can be significantly reduced in terms of volume and is no longer required in situ when replacing a contactor. The storage of replacement parts for the customer is greatly simplified because the number of variants being stored as replacement parts is reduced.

The term automatic within the context of the invention is aimed at the fact that the configuration no longer needs to be carried out manually by a technician but automatically by machine. An electronics system installed in the contactor is preferably used here.

A magnetic drive is a construction for switching devices that is conventional, for example, in medium-voltage installations, where a magnetic field is generated in said switching devices by way of one or more coils under voltage, the magnetic field attracting another ferromagnetic metal part, for example a metal plate called an armature plate. This attraction brings about a movement that is transferred to a movable contact in the switching device and presses same against the fixed contact. Two coils, which can be connected in parallel or in series, are typically used. This has the advantage that the magnetic force can be kept approximately equal, even if the input voltage is different the coils due to different rated voltages of the power supply in different countries, as mentioned at the beginning. The two coils of the magnetic drive exerts an attractive force on the magnet armature in the switched-on stage. The transfer mechanism translates the movement of the magnet armature into a movement of the movable contact toward the fixed contact and for this purpose comprises, for example, a toggle lever. The magnetic drive has controllable switching devices for the coils.

An actuating device is, for example, an electronic circuit or a processor that can be configured based on a measured input voltage in order to control the magnetic drive for the coils thereof. Switch-on and holding currents for the coils are regulated.

In the context of the invention, a vacuum switching device has, for example, a fluid-tight housing, in the interior of which there is a vacuum (or an extremely low gas pressure below 0.1% atmospheric pressure). If a movable contact is rapidly pulled away from a fixed contact, for example by means of a spring force, a resulting arc is quickly extinguished because, amongst other things, there is hardly any ionizable medium for a flow of current. Vacuum switching devices are particularly well suited for switching alternating current because an arc always breaks down at the zero crossing of the voltage.

The configuration device is a core aspect of the invention. It comprises, for example, a voltage measuring device in order to measure the input voltage. Furthermore, the configuration device can configure the actuating device for the measured input voltage, that is to say can communicate the measured input voltage as a digital or analog value to the actuating device. Furthermore, the configuration device can automatically actuate the controllable switching devices and in this way interconnect the coils in parallel and series depending on the measured input voltage. The configuration device comprises, for example, an electronic circuit or a processor for data processing.

In a preferred embodiment of the arrangement according to the invention, the configuration device is designed to connect the coils in parallel for a measured input voltage of 90 V to 150 V and to connect them in series for a measured input voltage of 180 V to 250 V. This is advantageous because the magnetic force of the coils is regulated to the designated level.

In a preferred embodiment of the arrangement according to the invention, the configuration device is designed to connect 28 the coils in parallel for a measured input voltage of 20 V to 29 V and to connect them in series for a measured input voltage of 40 V to 72 V. This is advantageous because the magnetic force of the coils is regulated to the designated level.

In another preferred embodiment of the arrangement according to the invention, the configuration device is designed to measure an AC voltage as the input voltage.

In another preferred embodiment of the arrangement according to the invention, the configuration device is designed to measure a DC voltage as the input voltage.

In another preferred embodiment of the arrangement according to the invention, the configuration device is designed to configure the actuating device for the measured input voltage 9 by virtue of switch-on and holding currents being set. This is advantageous because the magnetic force of the coils is regulated to the designated level.

In another preferred embodiment of the arrangement according to the invention, the controllable switching devices comprise at least one of the following switching devices: MOSFET, IGBT, relay. A MOSFET is a metal-oxide semiconductor field-effect transistor and an IGBT is an insulated-gate bipolar transistor. A relay is a switch operated by currents and activated remotely and generally having two switching positions. The relay is activated by means of a control circuit and can switch other circuits.

In another preferred embodiment of the arrangement according to the invention, the configuration device is designed to measure the input voltage and to configure the actuating device and to interconnect the coils before each switching process. The level of the input voltage is detected before each switching process. This results, for example, in a delay to the switch-on. In the case of an AC voltage as the input voltage, it is possible to wait, for example, a half-wave, that is to say 10 ms at 50 Hz and 8.3 ms at 60 Hz, in order to reliably detect the input voltage. In the case of a DC voltage as the input voltage, there is no delay. If the input voltage is detected by means of an analog-to-digital converter, there is still an additional delay time here due to the conversion and evaluation processes in the firmware. However, this delay time ranges from a few us up to at most 1 ms, depending on the type of converter. It is therefore negligible. An additional delay in the range of a few ms would arise when using relays for switching the coils. This delay does not occur when using electronic switches such as MOSFETs and IGBTs. This embodiment has the advantage that no manual intervention in order to parameterize the arrangement is required when changing the input voltage during running operation.

In another preferred embodiment of the arrangement according to the invention, the configuration device is designed to measure the input voltage upon initial start-up and to save the configuration actuating device and the f the interconnection of the coils as a data set in a data memory.

The level of the input voltage is identified by way of one or more test circuits, for example, only once automatically upon first start-up at the end customer. All necessary configurations for the coil interconnection and the setting of the switch-on and holding currents are stored continually in the data memory and can be amended or overwritten after start-up only by manual intervention.

An advantage of this embodiment is that there is no delay upon switch-on. Furthermore, this embodiment is less sensitive to (smaller) fluctuations in the input voltage.

In another preferred embodiment of the arrangement according to the invention, the data memory is designed to be able to reliably store the data set in the zero-voltage state as well. The data memory may be designed, for example, as what is known as a nonvolatile memory, that is to say that the information stored remains so on a permanent basis—that is to say even while the computer is not in operation or not supplied with power. It is possible to use, for example, solid-state-discs (SSD) or flash memories or nonvolatile random-access memories (NVRAM RAM). An electrically erasable programmable read-only memory (EEPROM) can also advantageously be used.

Proceeding from the known contactor, the object of the invention is to specify a method using which it is simple, fast and reliable to modify the magnetic drive for another input voltage.

The invention achieves this object by way of a method for automatically configuring a magnetic drive as claimed in the independent method claim. Preferred embodiments of the method according to the invention are explained in the dependent claims. The same advantages as explained at the beginning for the arrangement according to the invention apply accordingly.

BRIEF DESCRIPTION OF THE DRAWING

The single FIGURE of the drawing is a schematic illustration of an arrangement for automatically configuring a magnetic drive.

DETAILED DESCRIPTION OF THE INVENTION

For a better explanation of the invention, the FIGURE shows a schematic illustration of an exemplary embodiment of an arrangement 1 according to the invention.

The arrangement 1 comprises a vacuum switching device 8-14 having a housing 14 that is fluid-tight and clear 13. Inside the housing 14, a movable contact 11 is pressed against a fixed contact 12. The closed state of the switch with switched-on magnetic drive 2-4, 16-19 is thus illustrated. A switching bar 8 is connected to the movable contact 11 by the housing 14, wherein, for example, a bellows, which is not illustrated, ensures maneuverability. A spring device 10, which is supported on a supporting plate 9 and is pretensioned in the illustrated closed state, is provided for mechanically separating the contacts 11, 12.

The switching bar 8 is connected to a toggle lever 5-7, wherein the first limb 6 and the second limb 5 are connected in an angularly stiff manner but are mounted so as to be able to rotate about the articulation 7. The second limb 5 is connected to an armature plate 4 made of metal, for example iron. This transfer mechanism 5-7 translates a movement of the magnet armature 4 into a movement of the movable contact 11 toward the fixed contact 12.

The magnetic drive 2-4, 16-19 comprises two coils 2, 3, which can be connected either in parallel or in series to controllable switching devices 16-19. In the illustrated switched-on state, an attractive force F is exerted on the magnet armature 4 and this is moved toward the coils 2, 3.

An actuating device 15 for the magnetic drive 2-4, 16-19 can be configured by means of a configuration device 20 for an input voltage measured by means of a voltage measuring device 21 on a grid line 22. The actuating device 15 regulates switch-on and holding currents for the coils 2, 3.

The magnetic drive 2-4, 16-19 comprises controllable switching devices 16-19 for the coils 2, 3. The configuration device 20 interconnects the coils 2, 3 in parallel or in series depending on the measured input voltage by means of the controllable switching devices 16-19.

The configuration device 20 comprises internal data communication links 30 which link a processor 24 to a data memory 23 and to a voltage measuring device 21 and the actuating device 15. Furthermore, the switching devices 16-19 are connected to the processor 24 and the actuating device 15 via data communication links 30.

The invention claimed is:

1. An arrangement for automatically configuring a magnetic drive, the arrangement comprising:

- a vacuum switching device having a movable contact and a fixed contact;
- a magnetic drive having a magnetic armature and two coils being connectable in parallel or in series, wherein said magnetic drive is configured, in a switched-on state, to exert an attractive force on said magnet armature and to move said magnet armature, said magnetic drive further having controllable switching devices for said coils;
- a transfer mechanism configured to translate a movement of said magnet armature into a movement of said movable contact toward said fixed contact;
- an actuator for said magnetic drive, said actuator configured for an input voltage; and
- a configuration device configured to measure the input voltage and to configure said actuator for the input voltage measured, and to connect said coils in parallel or in series by means of said controllable switching devices depending on the input voltage measured, said configuration device is configured to connect said coils in parallel for the input voltage of 90 V to 150 V and to connect the coils in series for the input voltage of 180 V to 250 V.

2. The arrangement according to claim 1, wherein said configuration device is configured to configure said actuator for the input voltage measured by virtue of switch-on and holding currents being set.

3. The arrangement according to claim 1, wherein said controllable switching devices are selected from the group consisting of: metal-oxide-semiconductor field-effect transistors, insulated-gate bipolar transistors and relays.

4. The arrangement according to claim 1, wherein said configuration device is configured to measure the input voltage and to configure said actuator and to interconnect said coils before each switching process.

5. The arrangement according to claim 1, further comprising a data memory, wherein said configuration device is configured to measure the input voltage upon initial start-up and to save a configuration of said actuator and an interconnection of said coils as a data set in said data memory.

6. The arrangement according to claim 5, wherein said data memory is configured to be able to reliably store the data set in a zero-voltage state.

7. A method for automatically configuring a magnetic drive, which comprises the following steps of:

- providing a vacuum switching device having a movable contact and a fixed contact;
- providing a magnetic drive having two coils being connectable in parallel or in series, wherein the magnetic drive is configured, in a switched-on state, to exert an attractive force on a magnet armature and to move the magnet armature;
- transferring a movement of the magnet armature into a movement of the movable contact toward the fixed contact by means of a transfer mechanism;
- measuring an input voltage by means of a measuring device;
- configuring an actuator for the magnetic drive based on the input voltage by means of a configuration device; and interconnecting the coils in parallel or in series depending on a measured input voltage by means of controllable switching devices of the magnetic drive and by means of the configuration device, wherein the coils are connected in parallel for the input voltage being 90 V to 150 V and are connected in series for the input voltage being 180 V to 250 V.

8. The method according to claim 7, wherein said actuator is configured for the measured input voltage by virtue of switch-on and holding currents being set.

9. The method according to claim 7, which further comprises selecting the controllable switching devices from the group consisting of: metal-oxide-semiconductor field-effect transistors, insulated-gate bipolar transistors and relays.

10. The method according to claim 7, wherein the input voltage is measured and the actuator is configured and the coils are interconnected before each switching process.

11. The method according to claim 7, wherein the input voltage is measured upon initial start-up and a configuration of the actuator and an interconnection of the coils are saved as a data set in a data memory.

12. The method according to claim 11, which further comprises using the data memory to reliably store the data set in a zero-voltage state.

* * * * *